United States Patent

Nishimoto

Patent Number: 6,100,466
Date of Patent: Aug. 8, 2000

[54] METHOD OF FORMING MICROCRYSTALLINE SILICON FILM, PHOTOVOLTAIC ELEMENT, AND METHOD OF PRODUCING SAME

[75] Inventor: Tomonori Nishimoto, Tsukuba, Japan

[73] Assignee: Canon Kabushiki Kaisha, Tokyo, Japan

[21] Appl. No.: 09/197,473

[22] Filed: Nov. 23, 1998

[30] Foreign Application Priority Data

Nov. 27, 1997 [JP] Japan .................................. 9-326238

[51] Int. Cl.⁷ .......................... C23C 16/24; C23C 16/50; H01L 31/20; H01L 31/075; H01L 21/205

[52] U.S. Cl. .......................... 136/258; 136/252; 136/261; 257/51; 257/52; 257/55; 257/49; 257/66; 257/428; 257/431; 438/485; 438/486; 438/487; 438/96; 438/97; 438/57; 427/585; 427/588

[58] Field of Search ................................. 136/252, 261, 136/258 PC, 258 AM; 257/51, 52, 55, 49, 66, 428, 431; 438/485, 486, 487, 96, 97, 57; 427/585, 588

[56] References Cited

U.S. PATENT DOCUMENTS

| 4,933,203 | 6/1990 | Curtins .................................. 438/485 |
| 5,677,236 | 10/1997 | Saitoh et al. ............................ 438/485 |

FOREIGN PATENT DOCUMENTS

| 848434 | 6/1998 | European Pat. Off. . |
| 919643 | 6/1999 | European Pat. Off. . |
| 57-187971 | 11/1982 | Japan . |

OTHER PUBLICATIONS

Keppner, H., et al. "Scope of VHF Plasma Deposition for Thin–Film Silicon Solar Cells", Conference Record of the Twenty Fifth IEEE Photovoltaic Specialists Conference—vol. 25, pp. 669–672, May 1996.

Fisher, D., et al., "The 'Micromorph' Solar Cell: Extending A–Si:H Technology Towards Thin Film Crystalline Silicon", Conference Record of the Twenty Fifth IEEE Photovoltaic Specialists Conference—vol. 25, pp. 1053–1060, May 1996.

Primary Examiner—Alan Diamond
Attorney, Agent, or Firm—Fitzpatrick, Cella, Harper & Scinto

[57] ABSTRACT

Provided is a method of forming a microcrystalline silicon film by a plasma CVD, which comprises introducing a high frequency electromagnetic wave into a film forming space through an electrode to induce a plasma thereby forming a deposited film on a substrate, wherein the relation of $400<Q<10000$ is satisfied when Q is defined as $Q=P\cdot f^2/d$ where d (cm) is the distance between the substrate and the electrode, P (Torr) is the pressure of the film forming space during formation of the deposited film, and f (MHz) is the frequency of the high frequency electromagnetic wave-forming method of microcrystalline silicon film for forming a microcrystalline silicon film by plasma CVD, wherein Q defined as $Q=P\cdot f^2/d$ satisfies the relational formula of $400<Q<10000$ where d (cm) is a distance between a substrate on which a deposited film is to be formed, and an electrode to which a high frequency electromagnetic wave for inducing a plasma is guided, P (Torr) is a pressure during formation of the deposited film, and f (MHz) is a frequency of the high frequency electromagnetic wave. This can provide a method of forming the microcrystalline silicon film suitable for the i-type layer of the pin type solar cell at a high rate, notwithstanding using a low-temperature process, without using a high-temperature process.

15 Claims, 5 Drawing Sheets

METHOD OF FORMING MICROCRYSTALLINE SILICON FILM, PHOTOVOLTAIC ELEMENT, AND METHOD OF PRODUCING SAME

BACKGROUND OF THE INVENTION

1. Field of the Invention

The present invention provides a method of forming a microcrystalline silicon film at a high rate by high-frequency plasma CVD using as a source gas at least a silicon compound such as silane, a photovoltaic element, and a method of producing the photovoltaic element. The microcrystalline silicon film according to the present invention is suitably applicable to thin film semiconductor elements such as thin film solar cells or thin film transistors.

2. Related Background Art

In the late 1970s valency control of the amorphous silicon based thin film became possible and research and development has been carried out since then to apply the amorphous silicon based thin film to photovoltaic elements typified by solar cells. To produce the photovoltaic element using an amorphous silicon based film or the like, the plasma CVD method using a high frequency (RF) typified by 13.56 MHz has been widely used. The photovoltaic element comprised of the amorphous silicon based film or the like produced by the high-frequency plasma CVD method achieved relatively good photoelectric conversion efficiency with a smaller amount of material, as compared with those of bulk monocrystalline or polycrystalline silicon, but has a problem in terms of the process speed. Specifically, the thickness of the amorphous silicon layer used for an active layer is several thousand Å and the forming rate thereof has to be controlled to a low rate of not more than several Å/s in order to obtain a good quality amorphous silicon layer. This made the reduction of process cost difficult.

In the case of plasma CVD using 13.56 MHz that the quality of formed films tend to be degraded abruptly with an increase of the thin film forming rate. The method also had a disadvantage in that it was not easy to increase the throughput in mass production. The plasma CVD method using the microwave (MW) typified by 2.45 GHz is also known as a method capable of forming a thin film with relatively good quality even at relatively large thin film forming rates. An example of formation of an intrinsic layer (i-type layer) by the microwave plasma CVD method includes, for example, "A-Si solar cells by microwave plasma CVD process," Kazufumi Azuma, Takeshi Watanabe, and Toshikazu Shimada, Extended Abstracts (The 50th Meeting); The Japan Society of Applied Physics, p 566 and the like. It is also known that use of the frequency in the VHF band around the frequency of 100 MHz is also effective to improve the quality and increase the speed for formation of amorphous silicon films. For example, U.S. Pat. No. 4,933,203 describes that in the frequency range of 25 to 150 MHz, amorphous silicon films of good quality can be obtained where a ratio f/d of frequency f (MHz) to inter-electrode distance d (cm) is in the range of 30 to 100 (MHz/cm). In the U.S. patent the relation of frequency to inter-electrode distance is specified as to the method of producing the amorphous silicon film, but the patent describes nothing about the method of producing the microcrystalline silicon film nor about specifying the forming pressure in the frequency range of not less than 150 MHz.

Incidentally, the thin film photovoltaic element using the amorphous silicon based thin film generally has a p-i-n junction structure and photoelectric conversion occurs principally in the i-type layer. Many attempts have been made for microcrystallizing the p-type layer and n-type layer in order to improve the junction characteristics between the p or n and i layers. For example, Japanese Patent Application Laid-Open No. 57-187971 discloses a method of increasing output current and output voltage by forming the i-type layer of amorphous silicon and forming at least the layer on the light incident side out of the p-type layer and n-type layer of microcrystalline silicon having an average grain size of not more than 100 Å. It is, however, difficult at present to suppress the phenomenon in which the defect density of the i-type layer increases during exposure to light to lower the photoelectric conversion efficiency (the so-called Staebler-Wronski effect), regardless of the forming method, in the case of the pin type solar cells using amorphous silicon for the i-type layer. This has been a major problem in practical use.

In recent years, attempts have been made to use i-type microcrystalline silicon for the photoelectric conversion layer of the amorphous silicon based thin film photovoltaic element. For example, the group of Shah et al. in Neuchatel University reported a pin type microcrystalline silicon solar cell without optical damage and with the photoelectric conversion efficiency 7.7% in which all the layers of p-layer, i-layer, and n-layer were made of microcrystalline silicon, at 25th IEEE PV Specialists Conference, Washington, May 13–17, 1996. The method of forming the microcrystalline silicon i-layer, employed by the group, was basically the same as the configuration of the conventional high-frequency plasma CVD method and did not use a high-temperature process of not less than 500° C. necessary for formation of the crystalline silicon thin films, such as the polycrystalline silicon thin film. In addition, the VHF-band frequency of 110 MHz is adopted as the plasma forming frequency.

As described above, the pin type solar cells using the i-type microcrystalline silicon film formed by the VHF-band frequency have an advantage of not being optically damaged while being capable of being produced in the low-temperature process. According to the aforementioned report by the group of Shah et al. of Neuchatel University, the deposition rate of the microcrystalline silicon i-type layer was 1.2 Å/s and the thickness thereof was 3.6 $\mu$m. It is seen from simple computation, that the time to form the microcrystalline silicon i-type layer is as long as eight or more hours. Although the conversion efficiency is relatively high and optical damage does not occur, the throughput is very small; as a consequence, it becomes difficult to reduce the cost. It is essential to drastically increase the forming rate of the microcrystalline silicon i-type layer in order to make the mass production of pin solar cells using microcrystalline silicon for the i-layer practical. It was, however, relatively recently that solar cells with relatively good photoelectric conversion efficiency were produced in the form of the pin type solar cells using microcrystalline silicon for the i-layer. Presently, little is known about the technology for increasing the forming rate of the i-type microcrystalline silicon layer. It is expected that, for example, use of a high-temperature process of not lower than 500° C. permits energy for crystallization to be obtained as thermal energy from the substrate and the increase of the film forming rate can be achieved thereby relatively easily. However, the use of the high-temperature process will pose problems of degradation of element characteristics due to mutual diffusion at the interfaces between the layers such as p/i and n/i, etc., as well as increase of the process cost, and so on.

The present invention concerns the above problems. Specifically, an object of the present invention is to provide a method of forming a microcrystalline silicon film suitable for the i-type layer of the pin type solar cell, at a high rate without using the high-temperature process. Another object of the present invention is to provide a method of forming a microcrystalline silicon film at the high rate of 2 to several ten Å/s, notwithstanding use of a low-temperature process of 150 to 500° C.

SUMMARY OF THE INVENTION

According to the present invention, there is provided a method of forming a microcrystalline silicon film by a plasma CVD, which comprises introducing a high frequency wave into a film forming space through an electrode to induce a plasma thereby forming a deposited film on a substrate, wherein the relation of 400<Q<10000 is satisfied when Q is defined as $Q=P \cdot f^2/d$ where d (cm) is the distance between the substrate and the electrode, P (Torr) is the pressure of the film forming space during formation of the deposited film, and f (MHz) is the frequency of the high frequency wave.

In the above forming method the preferred ranges of the various parameters are as follows; the frequency of the high frequency wave is in the range of 50 to 550 MHz, the temperature of the substrate is in the range of 150 to 500° C., the forming pressure is in the range of 0.01 to 0.5 Torr, and the input power density of the high frequency wave is in the range of 0.001 to 0.5 W/cm³.

Further, it is preferred that the total flow rate of source gases (silicon compound gas and dilution gas) is not less than 500 sccm and the ratio of the dilution gas to the silicon compound gas is not less than 20. In addition, it is also preferred that a second high-frequency wave, which does not contribute substantially to decomposition of the source gas, is superimposed on the plasma.

The method of forming a microcrystalline silicon film according to the present invention can be applied to a method of producing a photovoltaic element, particularly, to a method of forming the i-type semiconductor layer.

Thus, according to the present invention, there is further provided a method of producing a photovoltaic element, which comprises the step of introducing a high frequency wave into a film forming space through an electrode to induce a plasma thereby forming a semiconductor layer on a substrate by use of a plasma CVD, the semiconductor layer having a microcrystalline silicon film as at least a part thereof, wherein the relation of 400<Q<10000 is satisfied when Q is defined as $Q=P \cdot f^2/d$, where, on the occasion of forming the microcrystalline silicon film, d (cm) is the distance between the substrate and the electrode, P (Torr) is the pressure of the film forming space during formation of the microcrystalline silicon film, and f is the frequency of the high frequency wave.

The present invention also provides a photovoltaic element having a microcrystalline silicon film formed by the aforementioned method of forming a microcrystalline silicon film.

DESCRIPTION OF THE PREFERRED EMBODIMENTS

The present invention will be described in detail with embodiments of the method of forming a microcrystalline silicon film and examples of production of a photovoltaic element according to the present invention, but it should be noted that the present invention is by no means intended to be limited to these examples.

In the examples detailed hereinafter, a microcrystalline silicon film according to the present invention was formed on a 7059 glass substrate (mfd. by Corning Glassworks), crystallinity was evaluated by the Raman scattering method, and grain sizes were estimated by the X-ray diffraction method. Further, solar cells were made by using the microcrystalline silicon film for the i-type layer of the pin type photovoltaic element and the cell characteristics thereof were evaluated.

Figure 1:
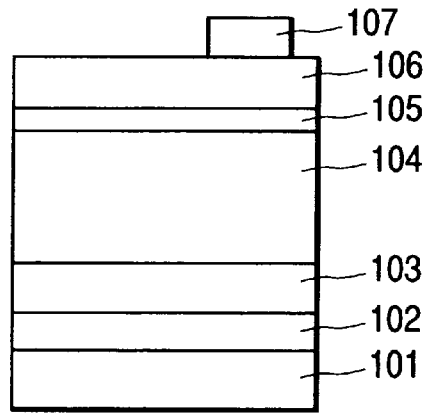
FIG. 1 is a schematic sectional view showing an example of the photovoltaic element of the present invention.

FIG. 1 is a schematic sectional view to show an example of a photovoltaic element according to the present invention. The photovoltaic element illustrated in FIG. 1 is of the pin type and is composed of a substrate 101, a light reflecting layer 102, an n-type layer 103, an i-type layer 104, a p-type layer 105, a transparent electrode layer 106, and a collector electrode 107.

Substrate 101

The substrate may be made of an electroconductive material alone or may be one in which an electroconductive layer is formed on a support made of either an electrically insulating material or an electrically conductive material. As the electroconductive material, there are included, for example, a plated steel sheet, NiCr, stainless steel, metals such as Al, Cr, Mo, Au, Nb, Ta, V, Ti, Pt, Pb, and Sn, or alloys of these metals. When these materials are used for the substrate, they are desirably a sheet form, a roll form obtained by rolling an elongated sheet in a cylindrical shape, or a cylindrical body.

As the insulating material, there are included synthetic resins such as polyester, polyethylene, polycarbonate, cellulose acetate, polypropylene, polyvinyl chloride, polyvinylidene chloride, polystyrene, and polyamide, or materials such as glass, ceramics, and paper. When these materials are used for the support, they are desirably provided in a sheet form, a roll form obtained by rolling an elongate sheet in a cylindrical shape, or a cylindrical body. For these insulating supports, an electroconductive layer is formed on at least one surface thereof and the semiconductor layers of the present invention are formed on the surface of the conductive layer.

For example, when the support is glass, it is preferable to form the electroconductive layer of a material such as NiCr, Al, Ag, Cr, Mo, Ir, Nb, Ta, V, Ti, Pt, Pb, $In_2O_3$, ITO, or ZnO, or an alloy thereof on the surface. When the support is a synthetic resin sheet of polyester film or the like, it is preferred to form the electroconductive layer of a material such as NiCr, Al, Cr, Ag, Pb, Mo, Au, Nb, Ta, V, Ti, or Pt, or an alloy thereof on the surface. When the support is stainless steel, it is preferred to form the electroconductive layer of a material such as NiCr, Al, Ag, Cr, Mo, Ir, Nb, Ta, V, Ti, Pt, Pb, $In_2O_3$, ITO, or ZnO, or an alloy thereof on the surface. As the forming method of the conductive layer, there can be preferably used a vacuum evaporation method, a sputtering method, and a screen printing method.

The surface configuration of the substrate or suport is desirably flat or of uneven (texture) structure having the maximum height of peak of 0.1 to 1.0 $\mu$m. For example, a method of texturing the surface of the stainless steel substrate is a method of etching the processing substrate with an acid solution. The thickness of the substrate is properly determined so as to be able to form a desired photovoltaic element. When the photovoltaic element is required to have flexibility, the substrate can be made as thin as possible within the scope in which the function as a substrate can be demonstrated adequately. It is, however, preferable that the thickness be normally 10 $\mu$m in terms of production and handling, and mechanical strength of the substrate.

Light Reflecting Layer 102

In a desired form of the photovoltaic element of the present invention, the light reflecting layer is made of a metal with high reflectance in the visible light to near infrared region, such as Ag, Al, Cu, AlSi, CuMg, etc. on the substrate. The light reflecting layer is preferably formed by the vacuum evaporation method, the sputtering method, or the electrodeposition method from an aqueous solution. The thickness of a layer of these metals as the light reflecting layer is preferably 10 nm to 5000 nm. When the substrate is prepared by forming the conductive layer on the support, it is possible to allow the conductive layer to function also as a light reflecting layer.

In a further desirable form of the photovoltaic element of the present invention, a transparent conductive layer of a material such as ZnO, $SnO_2$, $In_2O_3$, ITO, $TiO_2$, CdO, $Cd_2SnO_4$, $Bi_2O_3$, $MoO_3$, $Na_xWO_3$, etc. is formed on the light reflecting layer. As the method of forming the transparent conductive layer, there are preferably included the vacuum evaporation method, the sputtering method, the electrodeposition method, the CVD method, the spraying method, the spin-on method, and the dipping method. The optimum thickness differs depending upon the refractive index of the layer, but a preferred range of the thickness is 50 nm to 10 $\mu$m. Further, for texturing the transparent conductive layer, for example, in the sputtering method, the forming temperature of the layer is set at 200° C. or higher. In either forming method, etching of the surface with a weak acid after formation of the film is also effective in enhancing the effect of texturing.

Doped layers (n-type layer 103 and p-type layer 105)

The matrix of the doped layers is preferably comprised of an amorphous silicon based semiconductor or a microcrystalline silicon based semiconductor. As the amorphous (abbreviated as "a-") silicon based semiconductor, there can be included a-Si:H, a-SiGe:H, a-SiC:H, a-SiO:H, a-SiN:H, a-SiCO:H, a-SiON:H, a-SiNC:H, a-SiCON:H, and so on. As the microcrystalline (abbreviated as "$\mu$c-") silicon based semiconductor, there are included $\mu$c-Si:H, $\mu$c-SiGe:H, $\mu$c-SiC:H, $\mu$c-SiO:H, $\mu$c-SiN:H, $\mu$c-SiCO:H, $\mu$c-SiON:H, $\mu$c-SiNC:H, $\mu$c-SiCON:H, and so on. The matrix may be an amorphous silicon based semiconductor containing microcrystalline silicon. The amount of a valency controller added for controlling the conductivity type to the p-type or the n-type is preferably in the range of 1000 atomic ppm to 10 atomic %. Hydrogen (H, D) and fluorine function to compensate for dangling bonds to increase the doping efficiency. The optimum content of hydrogen and fluorine is 0.1 to 30 atomic %. Particularly, when the doped layer comprises microcrystalline silicon, the optimum content thereof is 0.01 to 10 atomic %. The content of carbon, oxygen, and nitrogen atoms as added is preferably in the range of 0.1 atomic ppm to 20 atomic % and, in the case where they are preferably included in a small amount, the preferred range is 0.1 atomic ppm to 1 atomic %. As for the electric characteristics, the activation energy is preferably not more than 0.2 eV and the specific resistance is preferably not more than 100 $\Omega$cm and most preferably not more than 1 $\Omega$cm. Deposition methods of the p-type layer or the n-type layer suitable for the photovoltaic elements are the RF plasma CVD method, the VHF plasma CVD method, and the microwave CVD method. Particularly, when the p-type layer or the n-type layer is deposited by the RF plasma CVD method, the optimum conditions are as follows; the substrate temperature in the deposition chamber 100 to 400° C., the internal pressure 0.1 to 10 Torr, the RF power 0.05 to 1.0 W/cm$^3$, and the deposition rate 0.01 to 3 nm/sec. As the source gas, there are included gasifiable compounds containing silicon, for example, such as $SiH_4$, $Si_2H_6$, $SiF_4$, $SiFH_3$, $SiF_2H_2$, $SiF_3H$, $SiH_3D$, $SiFD_3$, $SiF_2D_2$, $SiD_3H$, $Si_2D_3H_3$, and the like. The source gas selected from these materials may contain an impurity material for valency control, for example a boron compound such as $B_2H_6$, $BF_3$, etc. for the p-type or a phosphorus compound such as $PH_3$, etc. for the n-type. $GeH_4$, $CH_4$, or the like may be added to the source gas if necessary. The aforementioned gasifiable compounds may be properly diluted with a gas such as $H_2$, He, Ne, Ar, Xe, Kr, etc. as occasion may demand, and be guided to the deposition chamber. Particularly, where a layer with little optical absorption or with a wide bandgap, such as the microcrystalline semiconductors or a-SiC:H, is deposited, the preferred conditions are as follows; the source gas is diluted with hydrogen gas by a factor of 2 to 100 and the RF power is set relatively high. In the case of the high-frequency plasma CVD method using RF of the frequency not more than 0.1 GHz, the frequency near 13.56 MHz is preferable. When the p-type layer or the n-type layer is formed by the high-frequency plasma CVD method using the VHF to microwave frequency not less than 0.1 GHz, the preferred conditions are as follows; the substrate temperature in the deposition chamber 100 to 400° C., the internal pressure 0.5 to 100 mTorr, and the high-frequency power 0.01 to 1 W/cm$^3$.

I-Type Layer 104

In the photovoltaic element of the present invention, the i-type layer is the most important layer for generating and transporting photo-excited carriers. The term "i-type layer" used herein refers to a substantially intrinsic layer. The substance and material of the i-type layer are similar to those of the above-stated doped layers except that the valency controller is not positively used. However, there is a case where the i-type layer may consequently be contaminated with a valency controller. There is also a case where a slight amount of a valency controller is intentionally incorporated into the i-type layer. In the high-frequency plasma CVD method using as a source gas the silicon compound such as silane, etc., the crystallinity, defect density, photosensitivity, or the like of the formed film can be controlled by adjusting the forming conditions (the frequency of a high frequency wave, the power of the high frequency wave, the substrate temperature, the forming pressure, the distance between the substrate and the electrode, the flow rates of source gases, the dilution percentage of a source gas, etc.). The inventor has carried out the research and development of the method of forming a microcrystalline silicon film suitable for the i-type layer of the pin type solar cell at a high speed (for example, 2 to several ten Å/s), notwithstanding the use of a low-temperature process (for example, 150 to 500° C.), as stated above. As a consequence, the inventor found out that there existed a relational equation for defining a range of the forming conditions for forming a microcrystalline silicon film with good quality, particularly, among the three parameters of the frequency f (MHz) of the high frequency wave, the forming pressure P (Torr), and the substrate-electrode distance d (cm).

In general, as the frequency f increases under the condition of a constant pressure P, decomposition of the source gas is promoted and the energy of ions and electrons present in the plasma increases. It is believed that this causes the deposited film to receive much energy from the ions and electrons in the plasma, whereby lattice relaxation is promoted, thereby improving the crystallinity. However, if the frequency f is increased while keeping the substrate-electrode distance d constant, the energy supplied from the plasma to the deposited film will become too large, thereby increasing the defect density in the deposited film or failing to form the deposited film itself because of etching action, depending upon circumstances. Therefore, the value of the substrate-electrode distance d capable of forming the film with good quality increases with increasing frequency f.

In the aforementioned U.S. Pat. No. 4,933,203, the range of the ratio f/d of frequency f to substrate-electrode distance d is specified for formation of films with good quality. However, this patent describes the optimum conditions for formation of amorphous silicon films and alloy films thereof with good quality but pays no attention to the formation of microcrystalline silicon films. If the pressure P is increased while keeping the substrate-electrode distance d constant, the plasma will tend to be more concentrated near the electrode and thus be placed away from the substrate, whereby it will be difficult to obtain adequate energy necessary for crystallization. Therefore, the frequency f for formation of good-quality films increases with increasing pressure P. The ratio of the pressure P to the inverse of the frequency f, which is P·f (=P/(1/f)), is considered to be a good parameter for defining the condition range for formation of good-quality films, like f/d.

According to the results of the research and development conducted by the inventor, where the microcrystalline silicon film was formed by the high-frequency plasma CVD method using the silicon compound, such as silane, as the source gas at a low temperature of not more than 500° C., the microcrystalline silicon film with good quality was able to be formed in the range of the frequency f of 50 to 550 MHz. However, it was observed that the optimum conditions of the various forming conditions differed between on the low frequency side and on the high frequency side even in the range of 50 to 550 MHz. Further, ranges of the optimum of the aforementioned f/d and P·f also varied, and it was thus found that only f/d and P·f were not enough to be used as parameters representing the optimum values in the wide range of f of 50 to 550 MHz. On the other hand, the inventor found out that another parameter (Q) defined as $P \cdot f^2/d$, which was the product of f/d and P·f, was able to specify the range of the forming conditions of the microcrystalline silicon film with good quality throughout almost all the range of 50 to 550 MHz and the range of the parameter was $400 < P \cdot f^2/d < 10000$. The range of each forming condition for obtaining the microcrystalline silicon film with good quality and at low cost is as follows; the frequency of the high frequency wave is in the range of 50 to 550 MHz, the substrate temperature in the range of 150 to 500° C., the pressure during formation of a deposited film (forming pressure) in the range of 0.01 to 0.5 Torr, and the input power density of the high frequency in the range of 0.001 to 0.5 W/cm$^3$. Especially, where the frequency of the high frequency power source is in the range of 50 to 200 MHz, the preferred conditions are as follows; the substrate temperature is in the range of 150 to 500° C., the forming pressure in the range of 0.1 to 0.5 Torr, and the input power density of the high frequency wave in the range of 0.001 to 0.2 W/cm$^3$. In the case where the frequency of the high frequency power source is in the range of 200 to 550 MHz, the preferred conditions are as follows; the substrate temperature is in the range of 150 to 500° C., the forming pressure in the range of 0.01 to 0.3 Torr, and the input power density of the high frequency wave in the range of 0.01 to 0.5 W/cm$^3$. Speaking of the flow rate of the source gas in terms of the increase of the speed for formation of microcrystalline silicon, the total flow rate of the source gases (silicon compound gas and dilution gas) is preferably not less than 500 sccm and the flow rate of the dilution gas is preferably not less than 20 when the flow rate of the silicon compound gas is defined as 1. Further, it is preferable in terms of improvement in the quality of the microcrystalline silicon film, to superimpose a second high frequency wave which does not contribute substantially to the decomposition of the source gas, on the plasma.

Action

The above-stated forming method permits formation of microcrystalline silicon films with good quality and at low cost. The detailed forming mechanism for formation of the microcrystalline silicon film is not clear yet, but the inventor assumes that the mechanism seems as follows. Specifically, in the aforementioned ranges of the forming conditions, the following can be expected to take place.

(1) Because the frequency range is higher than 13.56 MHz conventionally used and thus the decomposition efficiency of the source gas and the temperature of plasma electrons are higher, the film formation can be performed at a low temperature and at a high speed.

(2) By selecting the pressure, the frequency, and the electrode distance, the amounts of radicals and ions arriving at the growing surface of the microcrystalline silicon film can be controlled, thereby changing the conditions to either of the amorphous film forming conditions, the microcrystalline film forming conditions, and the etching conditions; particularly, the conditions to meet the range of $400 < P \cdot f^2/d < 10000$ are considered to be those under which ions and radicals to urge crystal growth are moderately incident while film-forming species are being supplied sufficiently.

(3) When the total flow rate of the source gases is relatively large, e.g. not less than 500 sccm, the effect of suppressing overdecomposition of the source gases is considered to be achieved in the discharge space. As a result, it is possible to suppress the increase of malignant precursors which will be the cause of degrading the quality of formed films. Especially, the suppression of the increase of malignant precursors is considered to be very important for formation of the microcrystalline film with good quality and at the high rate of not less than 5 Å/s. Further, it is also considered that when the ratio of the dilution gas to the silicon compound gas is not less than 20, the effect of hydrogen radicals drawing hydrogen from the film is enhanced, thus promoting the microcrystallization. In addition, by superimposing the second high frequency wave which does not contribute substantially to the decomposition of the source gases, on the plasma, the potential distribution of the plasma can be controlled, whereby the species of ions arriving at the film forming surface can be changed, thereby permitting control of the quality of formed films.

Transparent Electrode Layer 106

As the material suitable for the transparent electrode layer of the photovoltaic element of the present invention, there are included indium oxide ($In_2O_3$), tin oxide ($SnO_2$), and ITO (indium tin oxide, $In_2O_3$—$SnO_2$). These materials may contain fluorine. The optimum method of depositing the transparent electrode layer is the sputtering method or the vacuum evaporation method. When the transparent electrode layer is deposited by the sputtering method, targets such as a metal target, or an oxide target may suitably be used alone or in combination. When the layer is deposited by the sputtering method, the temperature of the substrate is an important factor and is preferably in the temperature range of 20° C. to 600° C. When the transparent electrode layer is deposited by the sputtering method, a preferred gas for sputtering is an inert gas such as Ar gas, etc. It is also preferable to add oxygen gas ($O_2$) to the inert gas as the occasion demands. Particularly, when the target is metal, the oxygen gas ($O_2$) is essential. Further, when sputtering of the target is carried out with the aforementioned inert gas or the like, the pressure of the discharge space is preferably 0.1 to 50 mTorr for effectively carrying out the sputtering. The deposition rate of the transparent electrode layer depends upon the pressure in the discharge space and the discharge voltage, and the preferred deposition rate is in the range of 0.01 to 10 nm/sec.

As the evaporation source suitable for deposition of the transparent electrode layer by vacuum evaporation, there are included metal tin, metal indium tin, an indium-tin alloy, or the like. Further, as the substrate temperature when the transparent electrode layer is deposited, a temperature within the range of 25° C. to 600° C. is suitable. Further, it is preferred that oxygen gas ($O_2$) is introduced and the deposition is carried out under a pressure in the range of $5 \times 10^{-5}$ Torr to $9 \times 10^{-4}$ Torr. By introducing oxygen in this range, the metal evaporated from the evaporation source reacts with oxygen in the vapor phase to deposit a good transparent electrode layer. The preferred range of deposition rate of the transparent electrode layer under the above conditions is 0.01 to 10 nm/sec. If the deposition rate is less than 0.01 nm/sec, the productivity will be lowered; on the other hand, if the deposition rate is larger than 10 nm/sec, the resultant film will be a coarse film, which is not preferable in terms of the transmittance, electric conductivity, and adhesion.

The transparent electrode layer is deposited thickly enough in such a range as to satisfy the conditions for an antireflection film. The specific range of the thickness of the transparent electrode layer is preferably 50 to 500 nm.

Collector Electrode 107

The collector electrode is provided for making up for the electric conductivity of the transparent electrode layer. For making more light incident to the i-type layer as the photovoltaic layer and for efficiently collecting generated carriers to the electrode, the shape of the collector electrode (which is the shape observed from the side of incidence of light) and the material thereof are important. Normally, the shape of the collector electrode is the comb shape and the width and number of lines thereof are determined depending upon the shape and size when observed from the light incident side of the photovoltaic element, the material of the collector electrode, and so on. The line width is normally about 0.1 mm to 5 mm. As the material for the collector electrode, there are used Fe, Cr, Ni, Au, Ti, Pd, Ag, Al, Cu, AlSi, C (graphite), and so on. Normally, those materials which have a small specific resistance, for example, metals such as Ag, Cu, Al, Cr, and C or alloys thereof are suitable. The collector electrode may be formed of a single layer or of a plurality of layers. The layers of these metals are preferably formed by the vacuum evaporation method, the sputtering method, the plating method, the printing method, or the like. As the film thickness thereof, 10 nm to 0.5 mm is suitable.

When the collector electrode is formed by the vacuum evaporation method, a mask having the shape of the collector electrode is brought into close contact on the transparent electrode layer, and a desired metal evaporation source is evaporated by an electron beam or resistance heating in vacuum to deposit the metal on the transparent electrode layer, thereby forming the collector electrode in the desired shape (pattern) on the transparent electrode layer. When the collector electrode is formed by sputtering, a mask having the shape of the collector electrode is placed in close contact on the transparent electrode layer, Ar gas is introduced into a vacuum, and DC is applied to a desired metal sputtering target to induce a glow discharge to thereby sputter the metal, thus forming the collector electrode in the desired shape on the transparent electrode layer.

When the collector electrode is formed by the printing method, a Ag paste, an Al paste, or a carbon paste is printed by a screen printing machine. Further, the collector electrode may be formed by bonding of a metal wire with an electro-conductive paste.

The above describes a photovoltaic element of the pin structure, but the present invention can also be applied to photovoltaic elements of stacked pin structures such as pinpin structure and pinpinpin structure, or photovoltaic elements of a nip structure or stacked nip structures such as nipnip structure, nipnipnip structure, and so on.

EXAMPLES

The present invention will be described in further detail with examples thereof, but it should be noted that the present invention is by no means intended to be limited to the following examples.

Figure 2:
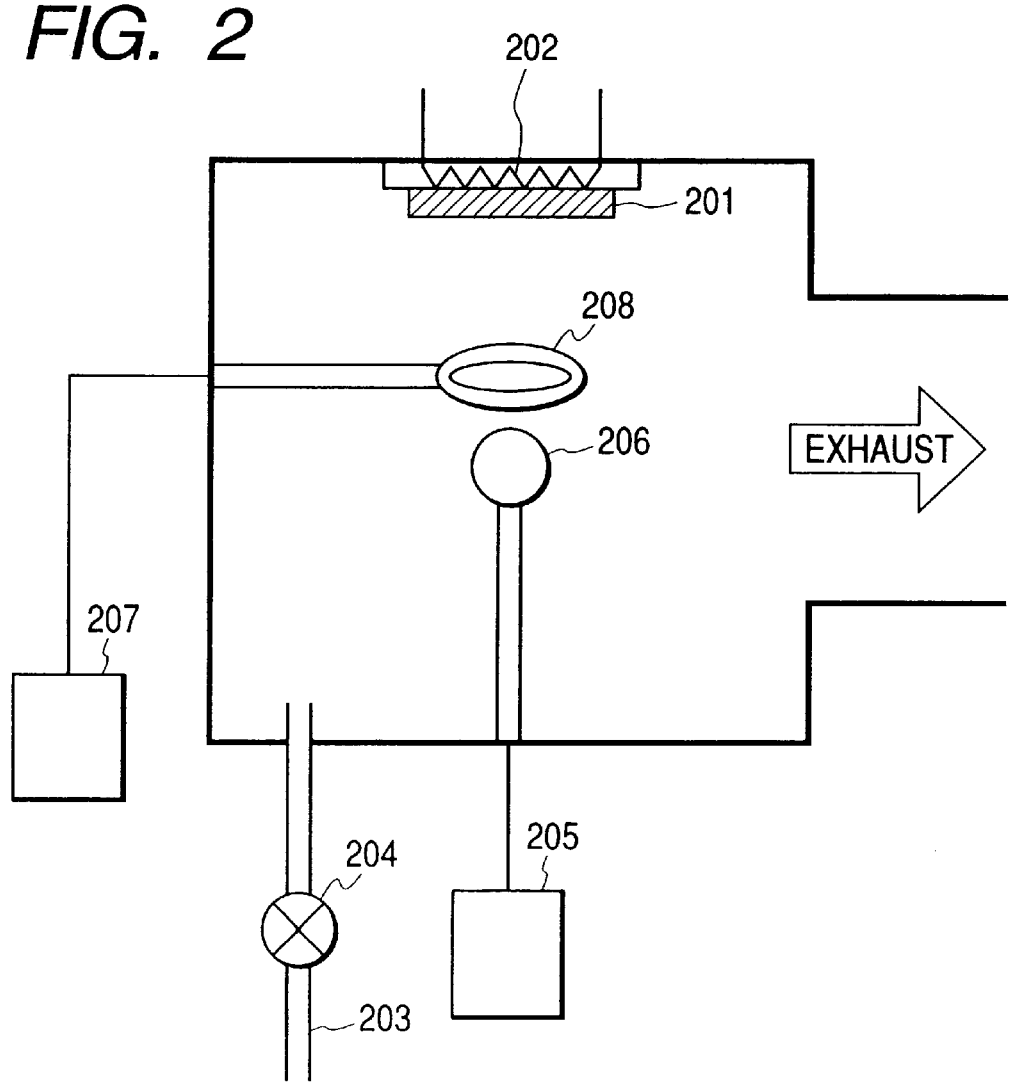
FIG. 2 is a schematic sectional view showing an example of an apparatus for forming the semiconductor thin film, used in the present invention.

FIG. 2 is a schematic view which shows an example of an apparatus for forming a semiconductor thin film used in the present invention. A substrate 201 was held in the upper part of the inner wall of the forming apparatus and was heated so as to be at a desired temperature by a heater 202. The source gases were introduced through a gas introducing pipe 203 and a valve 204 into the forming chamber. As the source gases, there were used $SiH_4$ gas and $H_2$ gas each purified to an ultrahigh purity. As the plasma generating source, there was used a power source 205 or a power source 207 in the frequency band of VHF or RF, respectively, alone or in combination of plurality as the occasion demanded. In this structure, a high-frequency power was introduced from the VHF electrode 206 and/or the RF electrode 208 into the forming chamber to induce a plasma. The substantial volume of the discharge space was about 3000 $cm^3$. Prior to the introduction of the source gases, the inside of the forming chamber was evacuated to about $10^{-5}$ Torr by use of a turbo molecular pump, thereby removing impurities.

Preliminary Experiment 1-1

Figure 3:
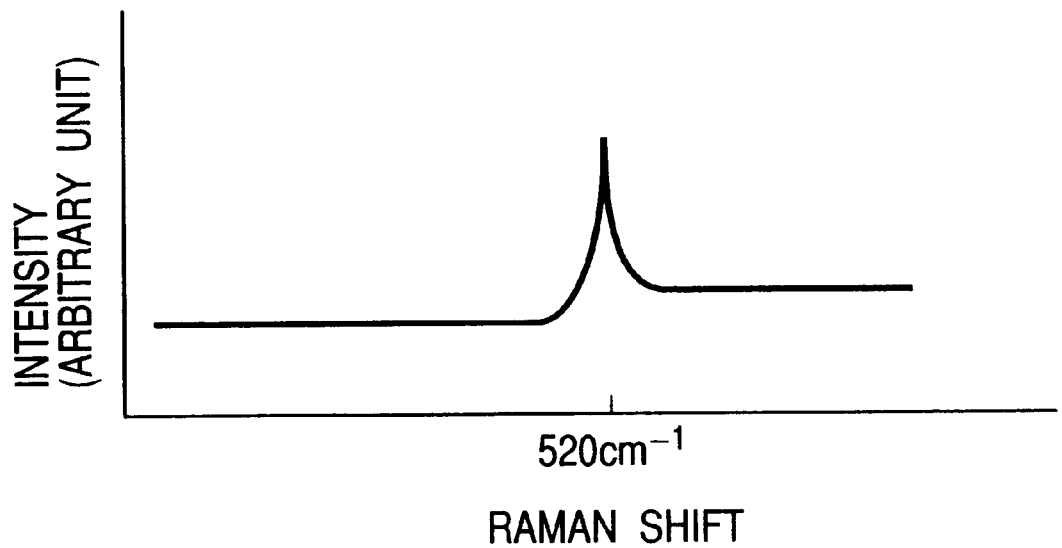
FIG. 3 is a chart showing a measurement result of microcrystalline silicon film by the Raman scattering method.
Figure 4:
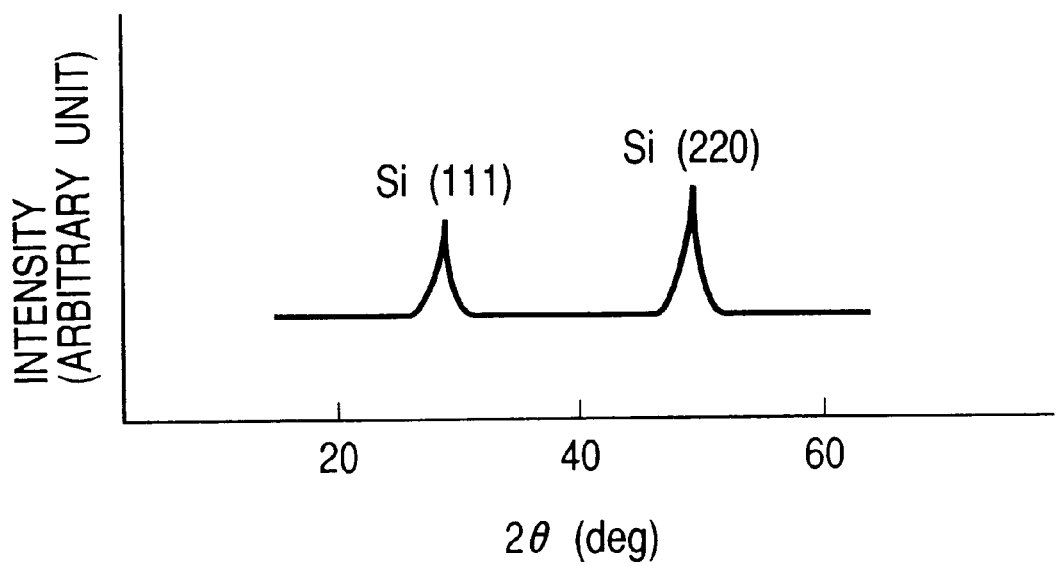
FIG. 4 is a chart showing a measurement result of microcrystalline silicon film by the X-ray diffraction method.

A microcrystalline silicon film was deposited in the thickness of about 1 μm on a 7059 glass plate (substrate)

under the conditions shown in Table 1 (f=105 MHz, P=0.3 Torr, d=3.0 cm, Q=1102). The deposited film was evaluated by the Raman scattering method and the X-ray diffraction method. The results are shown in FIG. 3 and FIG. 4, respectively. It was confirmed from the result of FIG. 3 that a definite peak was observed near the Raman shift 520 cm$^{-1}$ and the deposited film was thus crystallized. From the result of FIG. 4, there appeared peaks of (111) orientation and (220) orientation in the formed film. The crystal grain size computed by use of the Sheller's formula based on the (220) peak was about 400 Å.

Preliminary Experiment 1-2

A microcrystalline silicon film was deposited in the thickness of about 1 μm on a 7059 glass substrate under the conditions shown in Table 2 (f=105 MHz, P=0.25 Torr, d=3.0 cm, Q=919). When the deposited film was evaluated by the Raman scattering method and the X-ray diffraction method, the results similar to those in <Preliminary Experiment 1-1> were obtained and it was thus verified that the deposited film was crystallized. Further, the crystal grain size computed by use of the Sheller's formula based on the (220) peak was about 250 Å.

Preliminary Experiment 1-3

A microcrystalline silicon film was deposited in the thickness of about 1 pm on a 7059 glass substrate under the conditions shown in Table 3 (f=500 MHz, P=0.05 Torr, d=6.0 cm, Q=1250). The deposited film was evaluated by the Raman scattering method and the X-ray diffraction method. The obtained results were similar to those in <Preliminary Experiment 1-1> and it was thus verified that the deposited film was crystallized. Further, the crystal grain size computed by use of the Sheller's formula based on the (220) peak was about 150 Å.

Preliminary Experiment 1-4

Film formation on a 7059 glass substrate was carried out with the forming pressure P and the substrate-electrode distance d in above-stated <Preliminary Experiment 1-1> to <Preliminary Experiment 1-3> being varied. As a result, it was clarified that in the range which satisfied the relational formula of 400<Q<10000, the definite peak was observed near the Raman shift 520 cm$^{-1}$ and the crystallized film was thus formed. The grain sizes estimated by X-ray diffraction were not less than 50 Å, and microcrystalline silicon films were obtained which had grain sizes suitable for application to the photoelectric conversion layer of the solar cell. On the other hand, in the ranges of Q not satisfying the relational formula of 400<Q<10000, the result was either one of deposition of an amorphous film, deposition of a microcrystalline film of grain sizes not more than 50 Å, and no film deposition, so that any good microcrystalline silicon film suitable for the photoelectric conversion layer was not obtained.

Production Examples of Solar Cell

Example 1

The present example is an example in which a solar cell was produced in the structure of FIG. 1 by use of the forming apparatus illustrated in FIG. 2. This example will be described below.

First, the substrate having the light reflecting layer was prepared. A stainless steel sheet 0.5 mm thick and 50×50 mm$^2$ in area was dipped in acetone and isopropyl alcohol, subjected to ultrasonic cleaning and thereafter was dried by hot air. Using the DC magnetron sputtering method, a Ag layer with a texturing structure was deposited in a thickness of 0.8 μm at a forming temperature 300° C., and then a transparent conductive film of ZnO with a texturing structure was deposited in a thickness of 4.0 μm at a forming temperature 300° C.

Next, pin layers were formed on the ZnO transparent conductive film by use of the deposition apparatus. The n-type layer was microcrystalline silicon containing hydrogen and was deposited in a thickness of about 200 Å by the RF method under the conditions of Table 4 (the forming temperature 230° C.), using a forming apparatus not shown. The i-type layer was microcrystalline silicon containing hydrogen and was deposited in a thickness of about 1.0 μm at a forming rate of about 2.0 Å/s by use of only VHF (the high frequency wave of 105 MHz) under the conditions of Table 1 (Q=1102), using the forming apparatus of FIG. 2. The p-type layer was microcrystalline silicon containing hydrogen and was deposited in a thickness of about 100 Å by the RF method under the conditions of Table 5 (the forming temperature 170° C.), using a forming apparatus not shown.

Subsequently, ITO was deposited as the transparent electrode layer in a thickness of about 600 Å by the vacuum evaporation method using resistance heating. Further, Au was selectively deposited as the collector electrode in a thickness of about 8000 Å with a mask in the vacuum evaporation method using an electron beam.

This pin type solar cell will be called (Cell-1).

Using the photoelectric conversion efficiency obtained for (Cell-1) as a reference value, pressure dependence and substrate-electrode distance dependence of cell characteristics were investigated.

Pressure Dependence

Figure 5A:
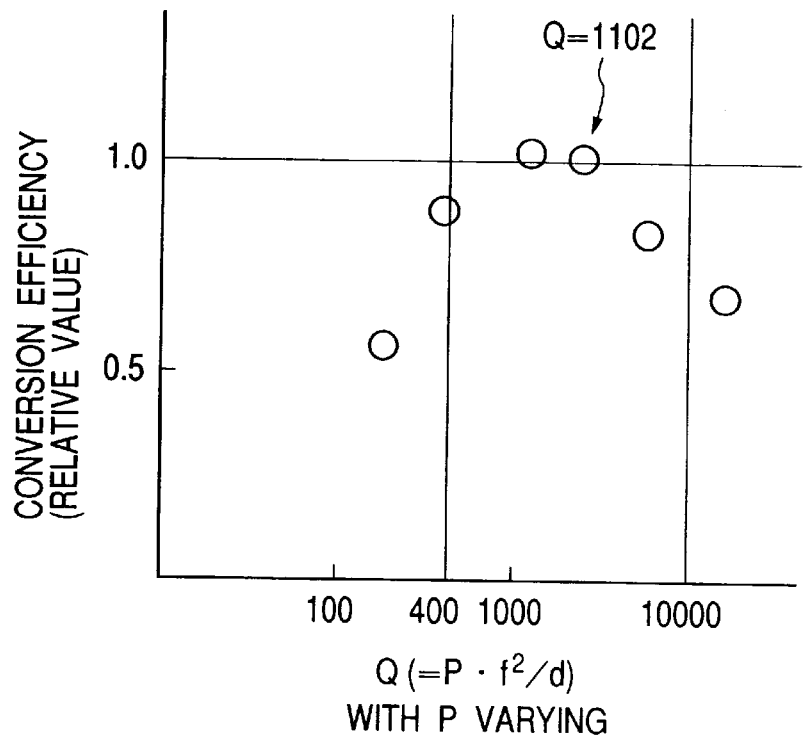
FIG. 5A and FIG. 5B are graphs showing relations between value Q and conversion efficiency, which correspond to Example 1.

Q was altered by varying the pressure (P) during formation of the i-type layer. Q=400 corresponds to P=about 0.1 Torr and Q=10000 to P=about 2.7 Torr. The attempt to optimize the cell was conducted under the conditions in which the film-forming rates were almost constant, with the result that good conversion efficiencies were obtained in the range of 400<Q<10000, as shown in FIG. 5A.

Substrate-Electrode Distance Dependence

Figure 5B:
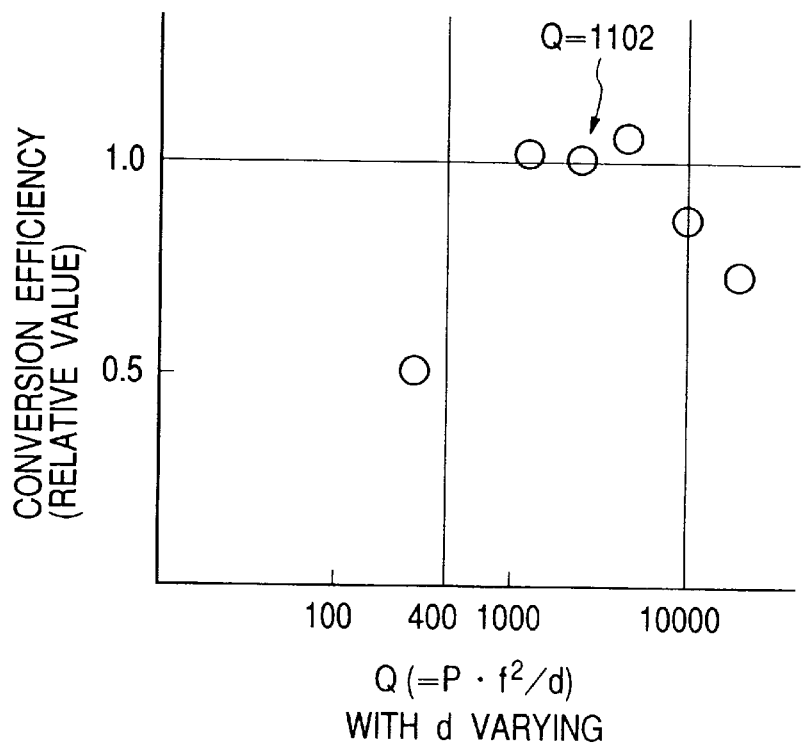

Q was altered by varying the substrate-electrode distance d during formation of the i-type layer. Q=400 corresponds to d=about 8.3 cm and Q=10000 to d=about 0.3 cm. The attempt to optimize the cell was conducted under the conditions in which the film-forming rates were almost constant, with the result that good conversion efficiencies were obtained in the range of 400<Q<10000, as shown in FIG. 5B.

Example 2

Subsequently, (Cell-2) was produced at a higher forming rate of the i-type layer than that of (Cell-1). In (Cell-2), the i-type layer was deposited in a thickness of about 1.0 μm at a forming rate of about 7.0 Å/s with superimposing RF (the high frequency wave of 13.56 MHz) on VHF (the high frequency wave of 105 MHz) as shown in Table 2 (Q=919). The change in the forming rate of the i-type layer due to the RF application was small, and the RF is therefore considered not to contribute substantially to the decomposition of the source gas. However, it was confirmed with good repeatability that the RF application improved the characteristics of the formed cell. The RF application is considered to achieve some effect, e.g., improvement in the potential distribution of plasma. Particularly, the effect of the RF application seems significant when forming microcrystalline silicon at high rates of not less than 5 Å/s.

Using the photoelectric conversion efficiency obtained for (Cell-2) as a reference value, the pressure dependence and substrate-electrode distance dependence of cell characteristics were investigated.

Pressure Dependence

Figure 6A:
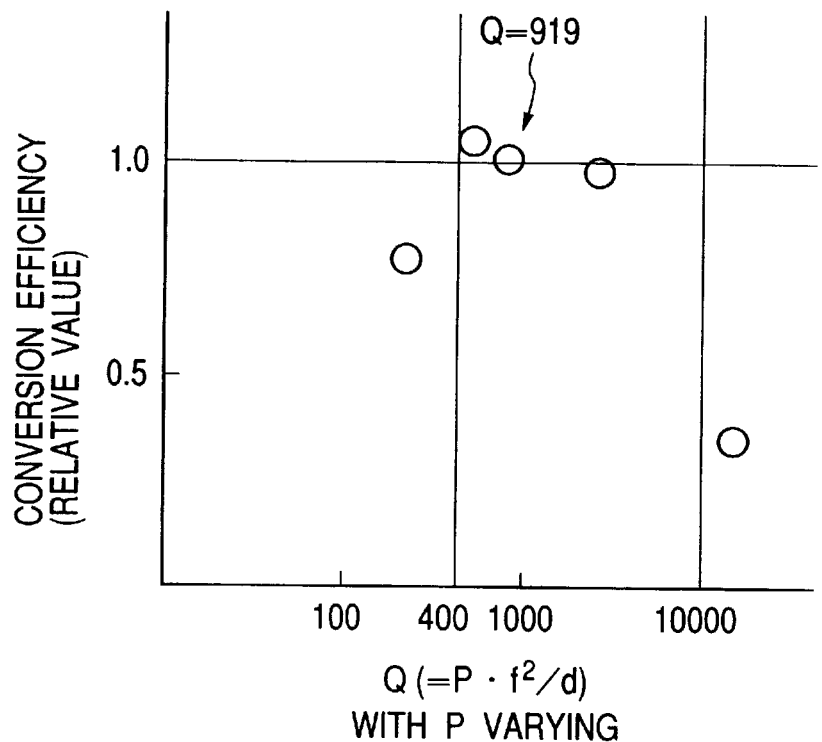
FIG. 6A and FIG. 6B are graphs showing relations between Q and conversion efficiency, which correspond to Example 2.

Q was altered by varying the pressure (P) during formation of the i-type layer. Q=400 corresponds to P=about 0.1 Torr and Q=10000 to P=about 2.7 Torr. The attempt to optimize the cell was conducted under the conditions in which the film-forming rates were almost constant, with the result that good conversion efficiencies were obtained in the range of 400<Q<10000, as shown in FIG. 6A.

Substrate-Electrode Distance Dependence

Figure 6B:
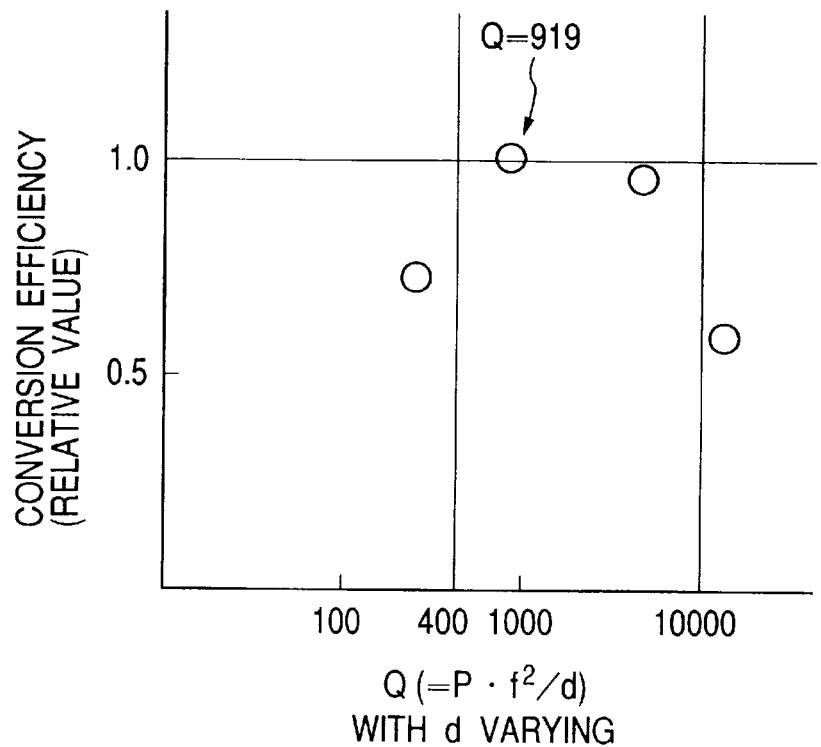

Q was altered by varying the substrate-electrode distance d during formation of the i-type layer. Q=400 corresponds to d=about 8.3 cm and Q=10000 to d=about 0.3 cm. The attempt to optimize the cell was conducted under the conditions in which the film-forming rates were almost constant, with the result that good conversion efficiencies were obtained in the range of 400<Q<10000, as shown in FIG. 6B.

Example 3

Subsequently, (Cell-3) was produced at a higher forming rate for the i-type layer than that of (Cell-2). In (Cell-3), the i-type layer was deposited in a thickness of about 1.0 μm at a forming rate of about 15 Å/s with superimposing RF (the high frequency wave of 13.56 MHz) on VHF (the high frequency wave of 500 MHz) as shown in Table 3 (Q=1250). The change in the forming rate of the i-type layer due to the RF application was small, and the RF is therefore considered not to contribute substantially to decomposition of the source gas. However, it was confirmed with good repeatability that the RF application improved the characteristics of the formed cell. The RF application is considered to achieve some effect, e.g., improvement in the potential distribution of plasma. The effect of the RF application seems significant also when forming microcrystalline silicon at a high rate of 15 Å/s, as described for (Cell-2).

Using the photoelectric conversion efficiency obtained for (Cell-3) as a reference value, the pressure dependence and substrate-electrode distance dependence of cell characteristics were investigated.

Pressure Dependence

Figure 7A:
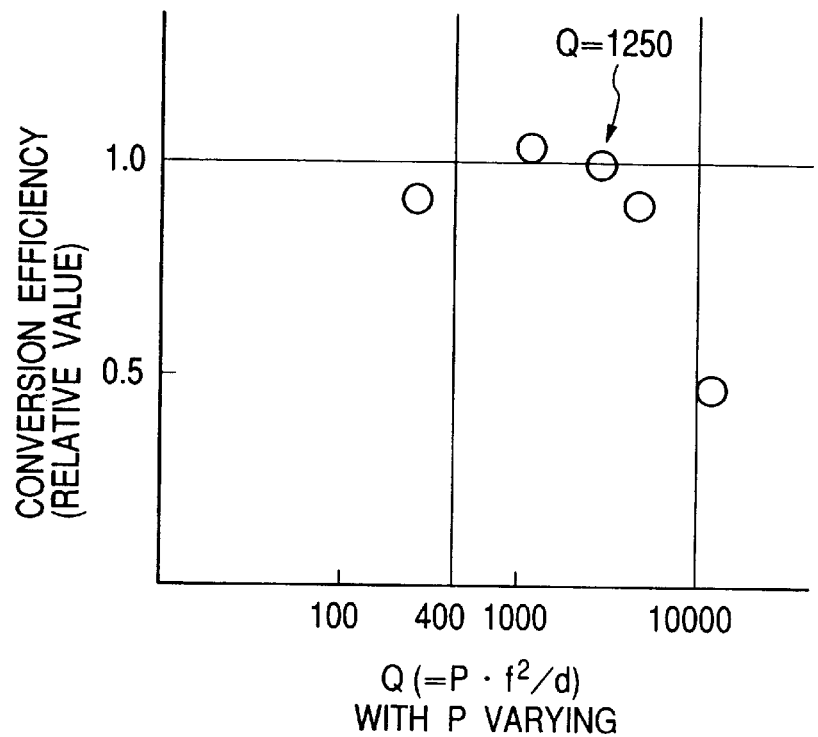
FIG. 7A and FIG. 7B are graphs to show relations between Q and conversion efficiency, which correspond to Example 3.

Q was altered by varying the pressure (P) during formation of the i-type layer. Q=400 corresponds to P=about 0.01 Torr and Q=10000 to P=about 0.24 Torr. The attempt to optimize the cell was conducted under the conditions in which the film-forming rates were almost constant, with the result that good conversion efficiencies were obtained in the range of 400<Q<10000, as shown in FIG. 7A.

Substrate-Electrode Distance Dependence

Figure 7B:
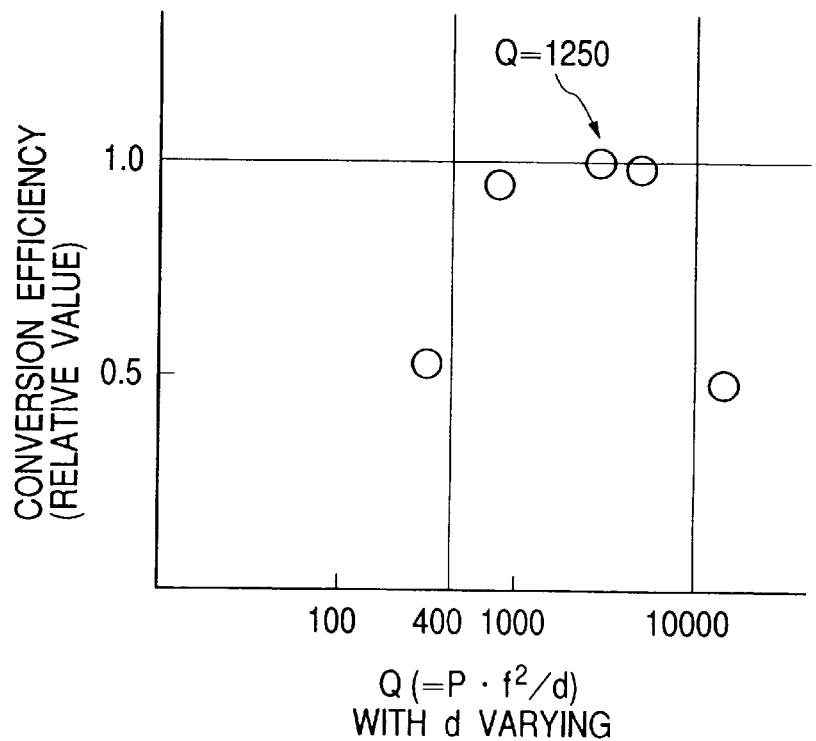

Q was altered by varying the substrate-electrode distance d during formation of the i-type layer. Q=400 corresponds to d=about 19 cm and Q=10000 to d=about 0.8 cm. The attempt to optimize the cell was conducted under the conditions in which the film-forming rates were almost constant, with the result that good conversion efficiencies were obtained in the range of 400<Q<10000, as shown in FIG. 7B.

TABLE 1

Forming conditions of i-type layer (frequency f = 105 MHz, pressure P = 0.3 Torr, distance d = 3.0 cm [Q = 1102])

| | |
|---|---|
| Gas flow rates | $SiH_4$ 20 sccm; $H_2$ 600 sccm |
| Forming temperature | 200° C. |
| VHF (105 MHz) power | 3 W |
| RF (13.56 MHz) power | not supplied |
| Forming rate | ~2.0 Å/s |

TABLE 2

Forming conditions of i-type layer (frequency f = 105 MHz, pressure P = 0.25 Torr, distance d = 3.0 cm [Q = 919])

| | |
|---|---|
| Gas flow rates | $SiH_4$ 60 sccm; $H_2$ 1800 sccm |
| Forming temperature | 250° C. |
| VHF (105 MHz) power | 150 W |
| RF (13.56 MHz) power | 10 W |
| Forming rate | ~7.0 Å/s |

TABLE 3

Forming conditions of i-type layer (frequency f = 500 MHz, pressure P = 0.03 Torr, distance d = 6.0 cm [Q = 1250]

| | |
|---|---|
| Gas flow rates | $SiH_4$ 60 sccm; $H_2$ 1650 sccm |
| Forming temperature | 350° C. |
| VHF (500 MHz) power | 400 W |
| RF (13.56 MHz) power | 20 W |
| Forming rate | ~15 Å/s |

TABLE 4

Forming conditions of n-type layer (n-type microcrystalline silicon: film thickness 200 Å)

| | |
|---|---|
| Gas flow rates | $SiH_4/H_2$ (10%) 4.0 sccm; $PH_3/H_2$ (2%) 1.0 sccm; $H_2$ 100 sccm |
| Forming pressure | 1.0 Torr |
| Forming temperature | 230° C. |
| RF (13.56 MHz) power | 15 W |
| Forming rate | 0.4 Å/s |

TABLE 5

Forming conditions of p-type layer (p-type microcrystalline silicon: film thickness 100 Å)

| | |
|---|---|
| Gas flow rates | $SiH_4/H_2$ (10%) 1.0 sccm; $BF_3/H_2$ (2%) 0.2 sccm; $H_2$ 35 sccm |
| Forming pressure | 2.0 Torr |
| Forming temperature | 170° C. |
| RF (13.56 MHz) power | 33 W |
| Forming rate | 0.6 Å/s |

As described above, according to the present invention, it is possible to form microcrystalline silicon with large grain sizes and with good quality in the range of high and low forming rates. Further, the microcrystalline silicon film according to the present invention is suitable to the photoelectric conversion layer of the thin film photovoltaic element and, therefore, it is possible to implement a low-cost thin film photovoltaic element with high conversion efficiency and high optical stability.

What is claimed is:

1. A method of forming a microcrystalline silicon film by a plasma CVD, which comprises the steps of:

providing an electrode for introducing a high frequency electromagnetic wave in a film forming space;

introducing a source gas comprising silicon atoms; and applying a high frequency to the electrode, thereby inducing the formation of a plasma and forming a deposited microcrystalline silicon film on a substrate, wherein the relation of $400 < Q < 10000$ is satisfied when Q is defined as $Q = P \cdot f^2 / d$ where d (cm) is the distance between the substrate and the electrode, P (Torr) is the pressure of the film forming space during formation of the deposited film, and f (MHz) is the frequency of the high frequency electromagnetic wave.

2. The method according to claim 1, wherein the frequency f of the high frequency electromagnetic wave is in the range of 50 to 550 MHz, the temperature of the substrate is in the range of 150 to 500° C., the forming pressure P is in the range of 0.01 to 0.5 Torr, and the input power density of the high frequency electromagnetic wave is in the range of 0.001 to 0.5 $W/cM^3$.

3. The method according to claim 1, wherein the frequency f of the high frequency electromagnetic wave is in the range of 50 to 200 MHz, the temperature of the substrate is in the range of 150 to 500° C., the forming pressure P is in the range of 0.1 to 0.5 Torr, and the input power density of the high frequency electromagnetic wave is in the range of 0.001 to 0.2 $W/cm^3$.

4. The method according to claim 1, wherein the frequency f of the high frequency electromagnetic wave is in the range of 200 to 550 MHz, the temperature of the substrate is in the range of 150 to 500° C., the forming pressure P is in the range of 0.01 to 0.3 Torr, and the input power density of the high frequency electromagnetic wave is in the range of 0.01 to 0.5 $W/cm^3$.

5. The method according to claim 1, wherein the total flow rate of the source gas comprising silicon atoms and a dilution gas is not less than 500 sccm and wherein the flow rate of the dilution gas is at least 20 times that of the source gas comprising silicon atoms.

6. The method according to claim 1, wherein a second high frequency electromagnetic wave, which does not contribute substantially to decomposition of the source gas, is superimposed on the plasma.

7. A photovoltaic element having a microcrystalline silicon film formed by the method of forming a microcrystalline silicon film as set forth in any one of claim 1 to claim 6.

8. The photovoltaic element according to claim 7, wherein the microcrystalline silicon film is an i-type semiconductor layer.

9. A method of producing a photovoltaic element, which comprises the steps of:

providing an electrode for introducing a high frequency electromagnetic wave in a film forming space;

introducing a source gas comprising silicon atoms; and applying a high frequency to the electrode, thereby inducing the formation of a plasma and forming a semiconductor layer on a substrate by use of a plasma CVD, wherein the semiconductor layer has a microcrystalline silicon film as at least a part thereof, and wherein the relation of $400 < Q < 10000$ is satisfied when Q is defined as $Q = P \cdot f^2 / d$, where d (cm) is the distance between the substrate and the electrode, P (Torr) is the pressure of the film forming space, and f is the frequency of the high frequency electromagnetic wave during formation of the microcrystalline silicon film.

10. The method according to claim 9, wherein the microcrystalline silicon film is an i-type semiconductor layer.

11. The method according to claim 9, wherein the frequency f of the high frequency electromagnetic wave is in the range of 50 to 550 MHz, the temperature of the substrate is in the range of 150 to 500° C., the forming pressure P is in the range of 0.01 to 0.5 Torr, and the input power density of the high frequency electromagnetic wave is in the range of 0.001 to 0.2 $W/cm^3$.

12. The method according to claim 9, wherein the frequency f of the high frequency electromagnetic wave is in the range of 50 to 200 MHz, the temperature of the substrate is in the range of 150 to 500° C., the forming pressure P is in the range of 0.1 to 0.5 Torr, and the input power density of the high frequency electromagnetic wave is in the range of 0.001 to 0.2 $W/cm^3$.

13. The method according to claim 9, wherein the frequency f of the high frequency electromagnetic wave is in the range of 200 to 550 MHz, the temperature of the substrate is in the range of 150 to 500° C., the forming pressure P is in the range of 0.1 to 0.3 Torr, and the input power density of the high frequency electromagnetic wave is in the range of 0.01 to 0.5 $W/cm^3$.

14. The method according to claim 9, wherein during formation of the microcrystalline silicon film, the total flow rate of the source gas comprising silicon atoms and a dilution gas is not less than 500 sccm and wherein the flow rate of the dilution gas is at least 20 times that of the source gas comprising silicon atoms.

15. The method according to claim 9, wherein during formation of the microcrystalline silicon film, a second high frequency electromagnetic wave, which does not contribute substantially to decomposition of the source gas, is superimposed on the plasma.

* * * * *

UNITED STATES PATENT AND TRADEMARK OFFICE
CERTIFICATE OF CORRECTION

PATENT NO. : 6,100,466  
DATED : August 8, 2000  
INVENTOR(S) : Tomonori Nishimoto Page 1 of 1

It is certified that error appears in the above-identified patent and that said Letters Patent is hereby corrected as shown below:

Column 1,  
Line 36, "that" should be deleted.

Column 4,  
Line 48, "a sheet" should read --in a sheet--.

Column 5,  
Line 10, "support" should read --support--; and  
Line 53, "layer 105)" should read layer 105) .--.

Column 11,  
Line 27, "1 pm" should read --1$\mu$m--.

Column 16,  
Line 6, "use of a" should be deleted.

Signed and Sealed this

Third Day of July, 2001

*Attest:*

*Attesting Officer*

NICHOLAS P. GODICI  
*Acting Director of the United States Patent and Trademark Office*